United States Patent
Kim

(10) Patent No.: US 9,386,702 B2
(45) Date of Patent: Jul. 5, 2016

(54) ELECTRONIC COMPONENT EMBEDDED SUBSTRATE AND METHOD OF MANUFACTURING ELECTRONIC COMPONENT EMBEDDED SUBSTRATE

(71) Applicant: SAMSUNG ELECTRO-MECHANICS CO., LTD., Suwon (KR)

(72) Inventor: Bong Soo Kim, Yeongi-gun (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 283 days.

(21) Appl. No.: 14/105,900

(22) Filed: Dec. 13, 2013

(65) Prior Publication Data

US 2014/0166343 A1    Jun. 19, 2014

(30) Foreign Application Priority Data

Dec. 14, 2012   (KR) .................. 10-2012-0146426

(51) Int. Cl.
| | | |
|---|---|---|
| H05K 1/16 | (2006.01) | |
| H05K 1/09 | (2006.01) | |
| H05K 1/18 | (2006.01) | |
| H05K 3/46 | (2006.01) | |

(52) U.S. Cl.
CPC .............. *H05K 1/185* (2013.01); *H05K 3/4602* (2013.01); *H05K 2201/10636* (2013.01); *H05K 2203/1469* (2013.01); *Y02P 70/611* (2015.11); *Y10T 29/49139* (2015.01)

(58) Field of Classification Search
CPC ................ H05K 1/185; H05K 3/4602; H05K 2201/10636; H05K 2203/1469; Y10T 29/49139
USPC .............. 174/260, 251; 361/761–764; 29/837
See application file for complete search history.

(56) References Cited

U.S. PATENT DOCUMENTS

| | | | | |
|---|---|---|---|---|
| 8,069,558 | B2 * | 12/2011 | Hirayama ............... | H05K 1/187 174/250 |
| 2001/0006119 | A1 * | 7/2001 | Sasaki ............... | H01L 23/49822 174/260 |
| 2005/0098338 | A1 * | 5/2005 | Kitae ....................... | H01L 24/10 174/546 |
| 2009/0084596 | A1 * | 4/2009 | Inoue ...................... | H01L 24/24 174/261 |
| 2010/0006330 | A1 * | 1/2010 | Fu .......................... | H01L 21/486 174/260 |
| 2011/0203836 | A1 * | 8/2011 | Yokota .................... | H01L 24/18 174/250 |
| 2012/0241205 | A1 * | 9/2012 | Shimizu ................. | H05K 1/188 174/260 |

(Continued)

FOREIGN PATENT DOCUMENTS

| | | |
|---|---|---|
| JP | 2002-76636 | 3/2002 |
| JP | 2003-168871 | 6/2003 |

(Continued)

OTHER PUBLICATIONS

Korean Office Action issued on May 20, 2014 in corresponding Korean Patent Application No. 10-2012-0146426.

*Primary Examiner* — Sherman Ng
(74) *Attorney, Agent, or Firm* — NSIP Law

(57) ABSTRACT

An electronic component embedded substrate and a method of manufacturing an electronic component embedded substrate, The substrate includes a first via passing through a part of an insulating portion of the substrate to an electrode of the electronic component, and a second via passing through a part of the insulating portion to the conductor pattern. The second via has a contact portion with a smaller cross-sectional area than the cross-sectional area of a contact portion of the first via.

33 Claims, 4 Drawing Sheets

(56) References Cited

U.S. PATENT DOCUMENTS

2013/0048361 A1* 2/2013 Yamashita ........ H01L 23/49822
174/260
2013/0081866 A1* 4/2013 Furutani ................ H05K 1/185
174/260

FOREIGN PATENT DOCUMENTS

| KR | 10-2006-0016058 | 2/2006 |
| KR | 10-0645613 | 11/2006 |
| KR | 10-2011-0006525 | 1/2011 |

* cited by examiner

ELECTRONIC COMPONENT EMBEDDED SUBSTRATE AND METHOD OF MANUFACTURING ELECTRONIC COMPONENT EMBEDDED SUBSTRATE

CROSS-REFERENCE TO RELATED APPLICATIONS

This application claims the foreign priority benefit under 35 U.S.C. Section 119 of Korean Patent Application Ser. No. 10-2012-0146426, filed Dec. 14, 2012 in the Korean Intellectual Property Office, the disclosure of which is hereby incorporated by reference in its entirety.

BACKGROUND

1. Field

Embodiments of the present invention relate to an electronic component embedded substrate and a method of manufacturing an electronic component embedded substrate.

2. Description of the Related Art

In recent times, as the trend of miniaturization and slimming of electronic devices accelerate, techniques of manufacturing a multilayer substrate and embedding various electronic components in the substrate have been proposed.

In FIG. 2 etc. of related art document Korean Patent Laid-open Publication No. 2011-0006525, a cross-sectional structure of a printed circuit board in which electronic components such as an active element and a passive element are embedded, and vias are provided to connect these electronic components to circuit patterns on an outer surface of the printed circuit board.

Further, in a multilayer printed circuit board, a separate inner circuit pattern may be provided as well as the embedded electronic component. This inner circuit pattern is also electrically connected to an upper layer or a lower layer through a via.

Components made of various materials are disposed in the electronic component embedded multilayer circuit board, and the materials of the respective components exhibit different characteristics.

A coefficient of thermal expansion (CTE) is also included in the different characteristics by materials. Accordingly, warpage occurs due to thermal shock etc. applied to the electronic devices when manufactured and used.

Meanwhile, according to the trend of miniaturization and slimming of the electronic devices, in a situation in which the size of electronic components embedded in a substrate becomes smaller and the thickness of the substrate itself become smaller, the warpage of the substrate may cause cracks in a connecting portion of the electronic component or the circuit pattern and the via, thus deteriorating reliability of the electronic devices.

Accordingly, a failure rate in the manufacturing process is increased and life of the product is reduced due to the cracks in the contact region of the external electrode of the electronic component such as MLCC and the via.

Further, as the miniaturization of the electronic components embedded in the substrate, the slimming of the substrate, and the miniaturization of the via accelerate, these problems become more serious.

SUMMARY

Embodiments of the present invention have been invented in order to overcome the above-described problems and it is, therefore, an object of the present invention to provide an electronic component embedded substrate with improved reliability.

Further, it is another object of the present invention to provide a method of manufacturing an electronic component embedded substrate with improved reliability.

In accordance with one aspect of the present invention to achieve the object, there is provided an electronic component embedded substrate including: an insulating layer having a cavity; an electronic component inserted in the cavity and including an external electrode; a conductor pattern provided on a surface of the insulating layer; a build-up insulating layer provided on the insulating layer and covering the conductor pattern and the electronic component; a first via passing through the build-up insulating layer and having a first contact portion in contact with the external electrode; and a second via passing through the build-up insulating layer and having a second contact portion which is in contact with the conductor pattern and has a smaller cross-sectional area than the first contact portion.

At this time, the electronic component may be an MLCC.

Further, a plurality of vias may be in contact with the conductor pattern, and the second via may be a via formed in the position closet to the first via among the vias formed in the conductor pattern.

Further, a contact surface of the electronic component and the first via and a contact surface of the conductor pattern and the second via may be positioned on the same horizontal plane.

At this time, the first via and the second via may have the same height.

Further, the cross-sectional area of the first contact portion may be more than 1.37 times the cross-sectional area of the second contact portion.

Further, a diameter of the first contact portion may be greater than 35 μm.

Further, the diameter of the first contact portion may be more than 1.17 times the diameter of the second contact portion.

Further, a maximum diameter of the first via may be larger than that of the second via.

Further, a surface of the conductor pattern may have a larger roughness than a surface of the external electrode.

Further, the build-up insulating layer may be filled in a space between the cavity and the electronic component, and the build-up insulating layer may be provided on and under the insulating layer.

Further, the conductor patterns may be provided on an upper surface and a lower surface of the insulating layer, and the second via may be in contact with the conductor patterns on and under the insulating layer.

Further, the first via may be in contact with the external electrode on and under the insulating layer.

In accordance with another aspect of the present invention, there is provided a method of manufacturing an electronic component embedded substrate, including: forming a cavity in an insulating layer; inserting an electronic component including an external electrode in the cavity and forming a conductor pattern on a surface of the insulating layer; forming a build-up insulating layer on the insulating layer to cover the conductor pattern and the electronic component; forming a first via hole, which exposes the external electrode, and a second via hole, which exposes the conductor pattern, through the build-up insulating layer; and forming a first via and a second via by providing a conductive material in the first via hole and the second via hole, wherein a cross-sectional area of a first contact portion of the first via in contact with the external electrode is larger than that of a second contact portion of the second via in contact with the conductor pattern.

In accordance with another aspect of the present invention, there is provided a substrate including an insulating portion; an electronic component embedded in the insulating portion; an internal conductor pattern in the insulating portion; a first via passing through a part of the insulating portion and having a first contact portion abutting and attached to an electrode of the electronic component; and a second via passing through a part of the insulating portion and having a second contact portion abutting and attached to the conductor pattern, the second contact portion having a smaller cross-sectional area than that of the first contact portion.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIGS. 4A through 4F are process cross-sectional views schematically showing the method of manufacturing an electronic component embedded substrate in accordance with an embodiment of the present invention, wherein FIG. 4A is a view schematically showing the state in which an insulating layer is provided, FIG. 4B is a view schematically showing the state in which a cavity is formed in the insulating layer, FIG. 4C is a view schematically showing the state in which an electronic component is inserted in the cavity and a conductor pattern is formed, FIG. 4D is a view schematically showing the state in which a build-up insulating layer is formed, FIG. 4E is a view schematically showing the state in which a first via hole and a second via hole are formed, and FIG. 4F is a view schematically showing the state in which a first via and a second via are formed.

DESCRIPTION OF EMBODIMENTS

Figure 1:
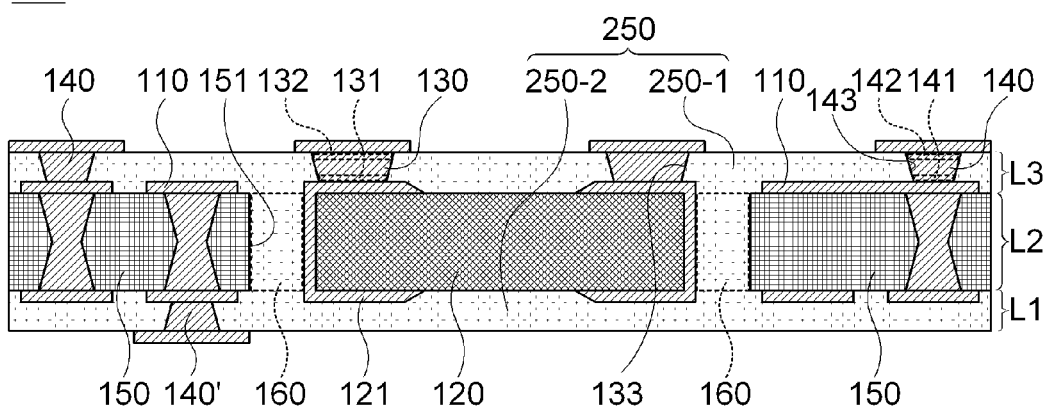
FIG. 1 is a cross-sectional view schematically showing an electronic component embedded substrate in accordance with an embodiment of the present invention.

Advantages and features of the present invention and methods of accomplishing the same will be apparent by referring to embodiments described below in detail in connection with the accompanying drawings. However, the present invention is not limited to the embodiments disclosed below and may be implemented in various different forms. The embodiments are provided only for completing the disclosure of the present invention and for fully representing the scope of the present invention to those skilled in the art. Like reference numerals refer to like elements throughout the specification.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

Hereinafter, configurations and operational effects of the present invention will be described in detail with reference to the accompanying drawings.

FIG. 1 is a cross-sectional view schematically showing an electronic component embedded substrate 100 in accordance with an embodiment of the present invention.

Referring to FIG. 1, the electronic component embedded substrate 100 in accordance with an embodiment of the present invention may consist of a plurality of layers and may have a conductor pattern 110 formed inside and an electronic component 120 embedded therein.

Particularly, the electronic component embedded substrate 100 in accordance with an embodiment of the present invention may include an insulating layer 150, the electronic component 120, the conductor pattern 110, a build-up insulating layer 250, a first via 130, and a second via 140.

The insulating layer 150 may have a cavity 151 for embedding the electronic component 120 therein.

The conductor pattern 110 may be provided on a surface of the insulating layer 150 and may be provided on one or both surfaces, that is, an upper surface and a lower surface of the insulating layer 150.

The electronic component 120 may have an external electrode 121 and may be a passive element such as MLCC.

A via in contact with the external electrode 121 of the electronic component 120 may be referred to as the first via 130, and a portion of the first via 130 in contact with the external electrode 121 of the electronic component 120 may be referred to as a first contact portion 131. Here, the first contact portion 131 is a portion of the first via 130 which has the smallest diameter.

Further, a via in contact with the conductor pattern 110 may be referred to as the second via 140, and a portion of the second via 140 in contact with the conductor pattern 110 may be referred to as a second contact portion 141. Here, the second contact portion 141 is a portion of the second via 140 which has the smallest diameter.

The second via 140 may be provided on the same insulating layer as the insulating layer in which the first via 130 is formed. In addition, the first via 130 and the second via 140 may have the same height.

Meanwhile, referring to FIG. 1, the electronic component embedded substrate 100 in accordance with an embodiment of the present invention may include a first layer L1, a second layer L2, and a third layer L3.

Here, the first layer L1, the second layer L2, and the third layer L3 may be made of an insulating material.

Particularly, the second layer L2 may perform a role of a core substrate, and although not shown, may have a stack structure including a plurality of layers. Further, the second layer L2 may be a metal core including a metal.

Further, when the second layer L2 is a metal core, a second insulating portion 160 may be provided in a region between the metal core and the electronic component 120.

Further, the build-up insulating layer 250 for forming a circuit may be formed at least one of above and below the insulating layer 150. In the drawing, for convenience of explanation, although the build-up insulating layer formed above the insulating layer 150 is referred to as a first build-up insulating layer 250-1 and the build-up insulating layer formed below the insulating layer 150 is referred as a second build-up insulating layer 250-2, they are not limited thereto. Here, the first build-up insulating layer 250-1 may form the third layer L3, and the second build-up insulating layer 250-2 may form the first layer L1.

When the electronic component 120 is inserted in the cavity 151 in a state in which the conductor pattern 110 is formed on the insulating layer 150, a detach film (not shown) for temporarily fixing the electronic component 120 may be attached to one surface of the insulating layer 150, and the first build-up insulating layer 250-1 may be formed on the other surface of the insulating layer 150 to fix the electronic component 120.

At this time, a material of the first build-up insulating layer 250-1 may be filled in an empty space between the electronic component 120 and the cavity 151 to fix the electronic component 120, and in FIG. 1, the region filled like this is indicated as the insulating portion 160.

Next, the detach film may be removed and the second build-up insulating layer 250-2 may be formed to embed the electronic component 120.

Further, in this case, it is preferred that the conductor pattern 110 is formed in a state in which an insulating material (not shown) is provided on a surface of the metal core.

In the related art, in order to overcome cracks between a via and a circuit pattern in a multilayer substrate, a method of improving a coupling force by forming a roughness on a surface of the circuit pattern to increase a contact surface area is applied.

At this time, since a process of forming the via in the substrate is generally performed by a uniform process, in the related art, the vias are formed with a similar size within a process variation range without distinguishing the via in contact with the circuit pattern inside the substrate and the via in contact with the electronic component inside the substrate.

However, when implementing a surface roughness on an external electrode of MLCC implemented with an ultra-small size, there is a limitation that it is difficult to implement the surface roughness with the level of a roughness formed on a surface of a typical inner circuit pattern.

That is, in the electronic component embedded substrate 100 in accordance with an embodiment of the present invention, a roughness formed on a surface of the conductor pattern 110 may be larger than a roughness formed on a surface of the external electrode 121.

When there is a difference in the surface roughness between the conductor pattern 110 and the external electrode 121 like this, possibility of occurrence of cracks is increased in the first via 130 in contact with the external electrode 121 compared to the second via 140 in contact with the conductor pattern 110.

In order to overcome this problem, in the electronic component embedded substrate 100 in accordance with an embodiment of the present invention, a cross-sectional area of the first contact portion 131 may be larger than that of the second contact portion 141.

More specifically, the cross-sectional area of the first contact portion 131 may be more than 1.37 times the cross-sectional area of the second contact portion 141.

On the other hand, a diameter of the first contact portion 131 may be greater than 35 µm.

Further, the diameter of the first contact portion 131 is more than 1.17 times the diameter of the second contact portion 141.

Further, the maximum value of the diameter of the first via 130 may be greater than the maximum value of the diameter of the second via 140.

Generally, in the process of processing a via hole using $CO_2$ laser etc. or by a photoresist method, laser or light is irradiated toward the inside of the substrate from the outside of the substrate.

Accordingly, a maximum diameter portion 132 of the first via 130 tends to be larger than the first contact portion 131 of the first via 130 in contact with the electronic component 120.

Similarly, a maximum diameter portion 142 of the second via 140 tends to be larger than the second contact portion 141 of the second via 140 in contact with the conductor pattern 110.

That is, the first via 130 and the second via 140 may have a shape in which their diameters become smaller from top to bottom.

Therefore, in the electronic component embedded substrate 100 in accordance with an embodiment of the present invention, since the cross-sectional area of the first contact portion 131 is larger than that of the second contact portion 141, a diameter of the maximum diameter portion 132 of the first via 130 may be equal to or larger than that of the maximum diameter portion 142 of the second via 140.

The upper surfaces of the conductor pattern 110 and the external electrode 121 may be positioned substantially on the same plane. In an embodiment, a sum of thicknesses of the conductor pattern 110 and the second layer L2 may be substantially equal to a thickness of the electronic component 120 including the external electrode 121. Accordingly, it is possible to minimize warpage of the substrate by configuring the arrangement of metal and insulating materials as symmetrical as possible.

Meanwhile, a contact surface of the first via 130 and the electronic component 120 and a contact surface of the second via 140 and the conductor pattern 110 may be positioned substantially on the same horizontal plane.

In an embodiment, the first via 130 and the second via 140 may have substantially the same height. Therefore, it is possible to easily adjust the cross-sectional area of the first contact portion 131 to be larger than that of the second contact portion 141 by increasing the maximum diameter portion when processing the second via 140.

Numerous vias may be formed in the electronic component embedded substrate 100. Among them, a via connected to the electronic component 120, that is, a passive element such as MLCC may be the first via 130, and the remaining vias except the first via 130 may be the second vias 140.

Further, among the remaining vias except the first via 130, the via formed in the position closet to the first via 130 may be the second via 140.

Figure 2:
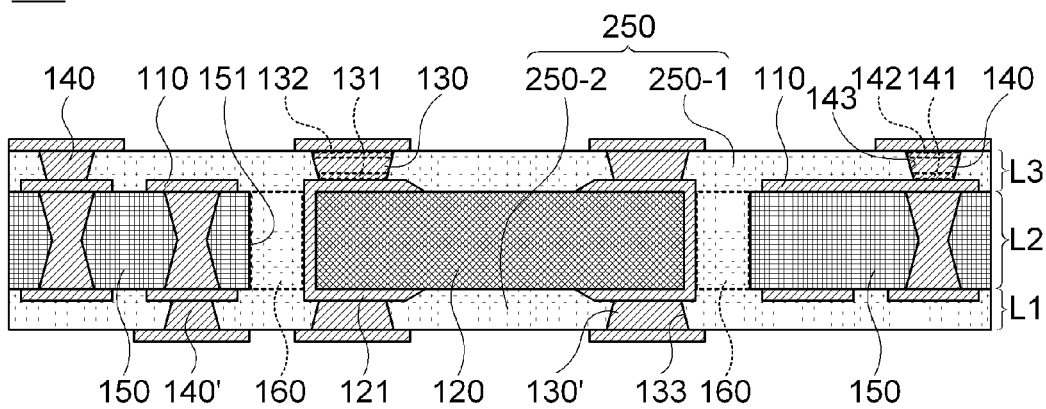
FIG. 2 is a cross-sectional view schematically showing an electronic component embedded substrate in accordance with another embodiment of the present invention.

FIG. 2 is a cross-sectional view schematically showing an electronic component embedded substrate 200 in accordance with another embodiment of the present invention.

Referring to FIG. 2, it will be understood that a conductor pattern also may be formed on a lower surface of an insulating layer 150 and a second via 140' also may be in contact with the conductor pattern.

Further, a first via 130' also may be in contact with a lower portion of the insulating layer 150, particularly a lower portion of the electronic component 120.

Descriptions overlapping with those described above will be omitted.

Figure 3:
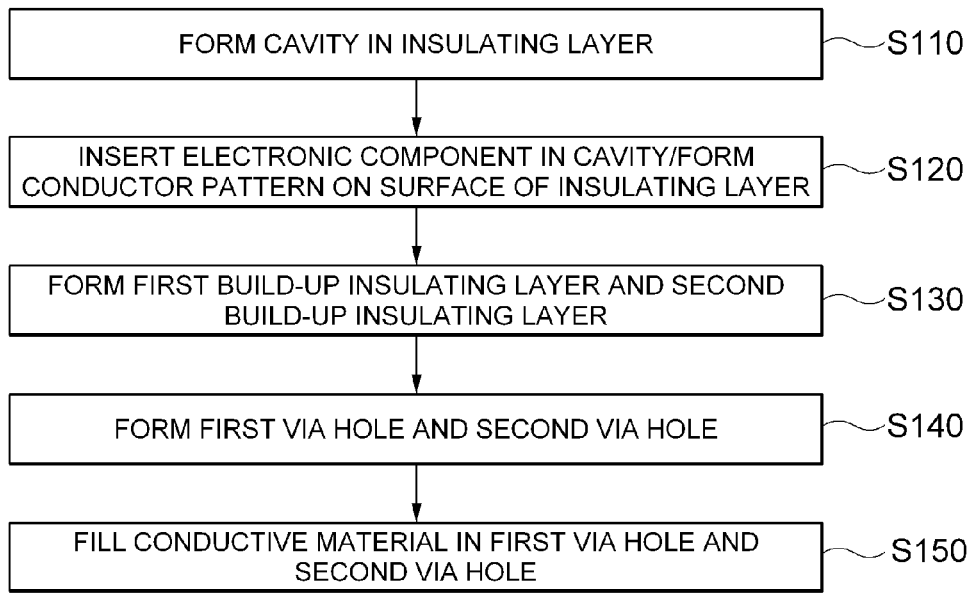
FIG. 3 is a flowchart schematically showing a method of manufacturing an electronic component embedded substrate in accordance with an embodiment of the present invention.
Figure 4A:
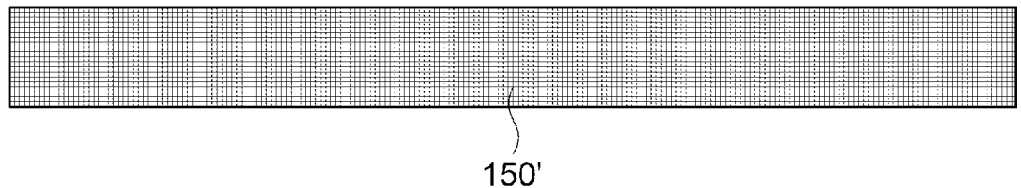
Figure 4B:
Figure 4C:
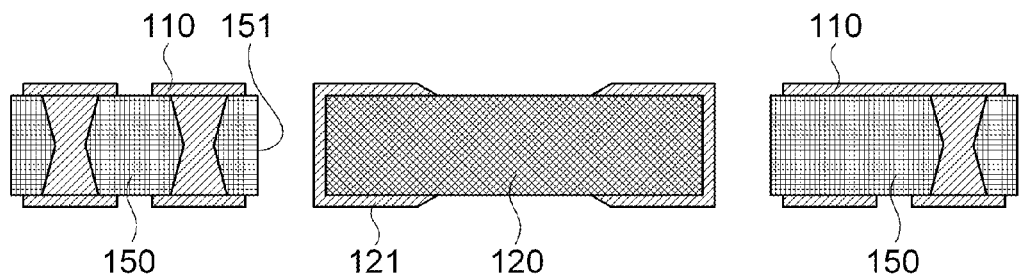
Figure 4D:
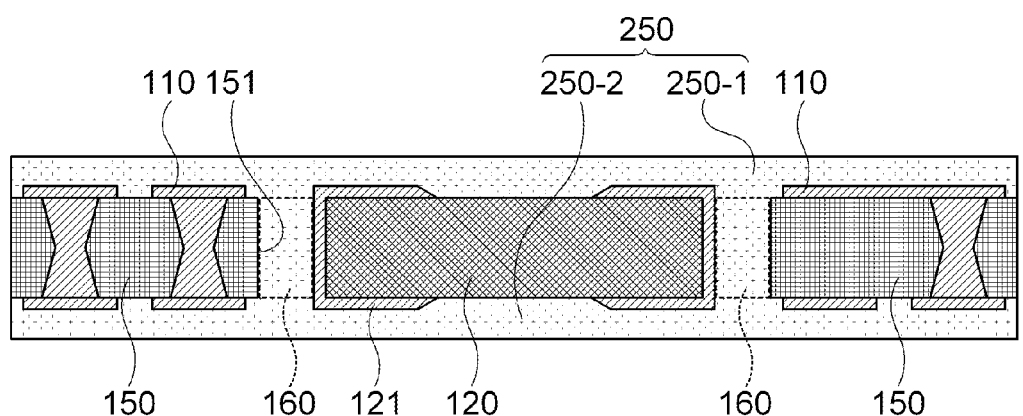
Figure 4E:
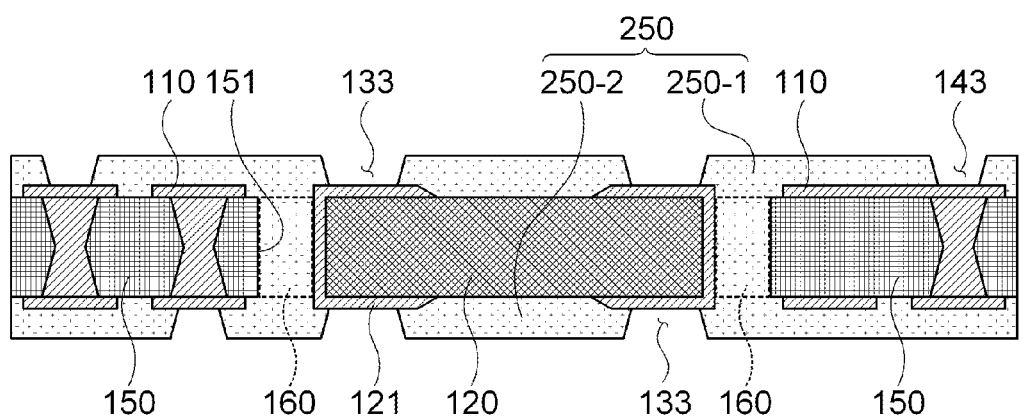
Figure 4F:
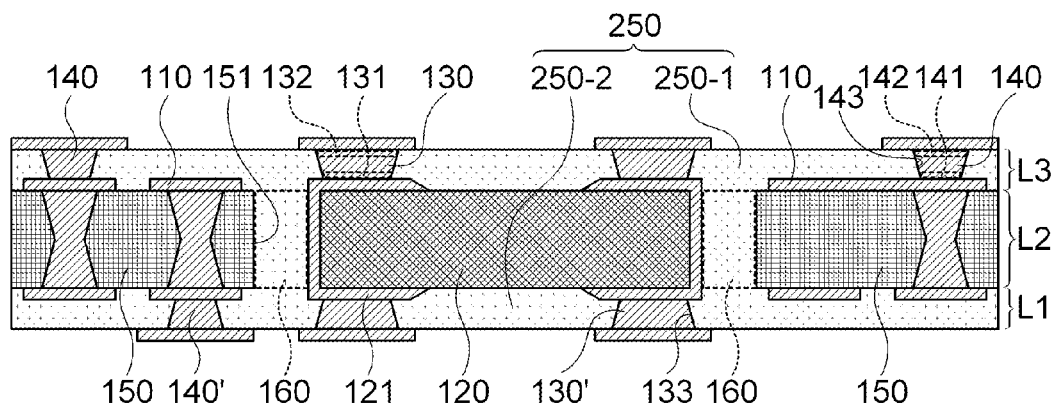

FIG. 3 is a flowchart schematically showing a method of manufacturing an electronic component embedded substrate 100 in accordance with an embodiment of the present invention, and FIGS. 4A through 4F are process cross-sectional views schematically showing the method of manufacturing an electronic component embedded substrate in accordance with an embodiment of the present invention, wherein FIG. 4A is a view schematically showing the state in which an insulating layer is provided, FIG. 4B is a view schematically showing the state in which a cavity is formed in the insulating layer, FIG. 4C is a view schematically showing the state in which an electronic component is inserted in the cavity and a conductor pattern is formed, FIG. 4D is a view schematically showing the state in which a build-up insulating layer is formed, FIG. 4E is a view schematically showing the state in which a first via hole and a second via hole are formed, and FIG. 4F is a view schematically showing the state in which a first via and a second via are formed.

Referring to FIGS. 4A through 4F and 3, the method of manufacturing an electronic component embedded substrate in accordance with an embodiment of the present invention may consist of the following processes.

First, as shown in FIGS. 4A and 4B, a cavity 151 is formed in an insulating layer 150 (S110).

Next, as shown in FIG. 4C, an electronic component 120 is inserted in the cavity 151, and a conductor pattern 110 is formed on a surface of the insulating layer 150 (S120).

At this time, the order of the process of forming the conductor pattern 110 and the process of inserting the electronic component 120 may be appropriately selected according to the need.

Further, when the conductor patterns 110 are formed on an upper surface and a lower surface of the insulating layer 150, the conductor patterns 110 formed on the upper surface and the lower surface may be electrically connected using a through via passing through the insulating layer 150.

Next, a first build-up insulating layer 250-1 is formed on the insulating layer 150, and a second build-up insulating layer 250-2 is formed under the insulating layer 150 (S130).

Of course, only one of the first build-up insulating layer 250-1 and the second build-up insulating layer 250-2 may be formed.

Next, a first via hole 133 and a second via hole 143 are formed (S140).

The first via hole 133 may expose an external electrode 121 of the electronic component 120, and the second via hole 143 may expose the conductor pattern 110.

Next, a first via 130 and a second via 140 are formed by providing a conductive material in the first via hole 133 and the second via hole 143 (S150).

At this time, the conductive material may be provided using a plating method etc.

Meanwhile, descriptions overlapping with those described above referring to FIGS. 1 and 2 will be omitted.

In a conventional process of forming a via in an electronic component embedded substrate, the via is formed by repetition of a uniform process without adjusting the size of the via according to whether the via is a via in contact with an electronic component which is a passive element such as MLCC.

Therefore, according to the conventional method, the via formed in the electronic component which is a passive element such as MLCC or all of the remaining vias just have a variation in the range of variation that may occur when performing the process.

However, there is a limitation in implementing a surface roughness in the external electrode 121 of the electronic component 120 which is a passive element such as an ultra small-sized MLCC, and there is a big difference in the surface roughness between the external electrode 121 of the electronic component 120 and the conductor pattern 110.

Accordingly, cracks are frequently generated in a contact region of the external electrode 121 of the electronic component 120, which is a passive element such as MLCC, and the first via 130 compared to a contact region of the conductor pattern 110 and the second via 140.

Further, as the electronic component 120 embedded in the substrate becomes smaller, the substrate becomes thinner, and the via becomes smaller, these problems become more serious.

Table 1 shows the test results of occurrence of cracks by applying severe conditions while changing the diameters of the first contact portion 131 and the second contact portion 141 in the electronic component embedded substrate 100 in accordance with an embodiment of the present invention.

In Table 1, MSL1 is a severe condition in which a sample is left in a chamber with an internal temperature of 85° C. and a humidity of 85% for 168 hours, MSL2 is a severe condition in which a sample is left in a chamber with an internal temperature of 85° C. and a humidity of 60% for 168 hours, and MSL3 is a severe condition in which a sample is left in a chamber with an internal temperature of 60° C. and a humidity of 60% for 4 hours.

Further, a sign 'X' means that cracks occur in the first via 130, and a sign 'O' means that cracks don't occur in the first via 130.

TABLE 1

| Classification | Diameter of first contact portion (μm) | Diameter of second contact portion (μm) | MSL1 | MSL2 | MSL3 |
|---|---|---|---|---|---|
| #1 | 30 | 20 | X | X | O |
| #2 | 30 | 30 | X | X | X |
| #3 | 30 | 40 | X | X | X |
| #4 | 35 | 20 | O | O | O |
| #5 | 35 | 30 | X | O | O |
| #6 | 35 | 40 | X | X | O |
| #7 | 40 | 30 | O | O | O |
| #8 | 40 | 40 | X | O | O |
| #9 | 40 | 50 | X | O | O |
| #10 | 45 | 30 | O | O | O |
| #11 | 45 | 40 | O | O | O |
| #12 | 45 | 50 | O | O | O |
| #13 | 50 | 40 | O | O | O |
| #14 | 50 | 50 | O | O | O |
| #15 | 50 | 60 | O | O | O |
| #16 | 55 | 40 | O | O | O |
| #17 | 55 | 50 | O | O | O |
| #18 | 55 | 60 | O | O | O |

Referring to Table 1, in the very severe conditions, when the diameter of the first contact portion 131 is less than 30 μm, cracks occur in the first via 130 regardless of the diameter of the second contact portion 141.

Therefore, according to an aspect of the present invention the diameter of the first contact portion 131 is greater than 30 μm.

Meanwhile, in the MSL3 which corresponds to a slightly severer condition than a general use condition, when the diameter of the first contact portion 131 is 30 μm and the diameter of the second contact portion 141 is about 20 μm, that is, when the sample #1 is tested only in the MSL3 condition, cracks don't occur in the first via 130.

Accordingly, even when the diameter of the first contact portion 131 is 30 μm, if the diameter of the first contact portion 131 is larger than the diameter of the second contact portion 141, furthermore, if the diameter of the first contact portion 131 is more than 1.5 times the diameter of the second contact portion 141, the possibility of occurrence of cracks in the first via 130 is reduced.

Further, in the MSL2 that is a severer condition than the MSL3, when the diameter of the first contact portion 131 is 35 μm, cracks don't occur in the first vias 130 of the sample #4 and the sample #5 of which the diameters of the second contact portions 141 are 20 μm and 30 μm, respectively, and cracks occur in the sample #6 of which the diameter of the second contact portion 141 is 40 μm.

That is, when the diameter of the first contact portion 131 is larger than the diameter of the second contact portion 141, the possibility of occurrence of cracks in the first via 130 is reduced.

Further, in the MSL1 which is the severest condition, when the diameter of the first contact portion 131 is 35 μm, cracks don't occur in the first via 130 of the sample #4 of which the diameter of the second contact portion 141 is 20 μm, and cracks occur in the sample #5 of which the diameter of the second contact portion 141 is 30 μm.

That is, when the diameter of the first contact portion 131 is more than 35/30 times the diameter of the second contact portion 141, the possibility of occurrence of cracks in the first via 130 is further reduced.

Summarizing the test results in the above Table 1, it is preferred that the diameter of the first contact portion 131 is greater than 35 μm.

Further, it will be understood that the possibility of occurrence of cracks in the first via 130 is reduced when the diameter of the first contact portion 131 is larger than the diameter of the second contact portion 141.

Furthermore, it will be understood that the possibility of occurrence of cracks in the first via 130 is reduced when the diameter of the first contact portion 131 is more than 1.17 times the diameter of the second contact portion 141.

Accordingly, it is possible to improve a yield of a manufacturing process and reliability in a use process by reducing a crack occurrence rate of the first via 130 electrically connected to the embedded electronic component 120.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An electronic component embedded substrate comprising:
   an insulating layer having a cavity;
   an electronic component having an external electrode, the electronic component provided in the cavity;
   a conductor pattern provided on a surface of the insulating layer;
   a build-up insulating layer provided on the insulating layer and covering the conductor pattern and the electronic component;
   a first via passing through the build-up insulating layer and having a first contact portion in contact with the external electrode; and
   a second via passing through the build-up insulating layer and having a second contact portion in contact with the conductor pattern, wherein the second contact portion has a smaller cross-sectional area than that of the first contact portion,
   wherein a lateral surface of the external electrode is in contact with the build-up insulating layer.

2. The electronic component embedded substrate according to claim 1, wherein the electronic component is a multi-layer ceramic capacitor (MLCC).

3. The electronic component embedded substrate according to claim 1, wherein a plurality of vias are in contact with the conductor pattern, and the second via is a via formed in the position closet to the first via among the vias formed in the conductor pattern.

4. The electronic component embedded substrate according to claim 1, wherein a contact surface of the electronic component and the first via and a contact surface of the conductor pattern and the second via are positioned on the same horizontal plane.

5. The electronic component embedded substrate according to claim 4, wherein the first via and the second via have the same height.

6. The electronic component embedded substrate according to claim 1, wherein the cross-sectional area of the first contact portion is more than 1.37 times the cross-sectional area of the second contact portion.

7. The electronic component embedded substrate according to claim 6, wherein a diameter of the first contact portion is greater than 35 μm.

8. The electronic component embedded substrate according to claim 6, wherein the diameter of the first contact portion is more than 1.17 times the diameter of the second contact portion.

9. The electronic component embedded substrate according to claim 6, wherein a maximum diameter of the first via is larger than that of the second via.

10. The electronic component embedded substrate according to claim 1, wherein a surface of the conductor pattern has a larger roughness than a surface of the external electrode.

11. The electronic component embedded substrate according to claim 1, wherein the build-up insulating layer fills a space between the cavity and the electronic component.

12. The electronic component embedded substrate according to claim 1, further comprising a further build-up insulating layer provided on and under the insulating layer.

13. The electronic component embedded substrate according to claim 12, wherein conductor patterns are provided on an upper surface and a lower surface of the insulating layer, and the second via is in contact with the conductor patterns on and under the insulating layer.

14. The electronic component embedded substrate according to claim 13, wherein the first via is in contact with the external electrode on and under the insulating layer.

15. A method of manufacturing an electronic component embedded substrate, comprising:
    forming a cavity in an insulating layer;
    inserting an electronic component having an external electrode in the cavity;
    forming a conductor pattern on a surface of the insulating layer;
    forming a build-up insulating layer on the insulating layer to cover the conductor pattern and the electronic component;
    forming a first via hole through the build-up insulating layer to expose an upper surface of the external electrode only;
    forming a second via hole through the build-up insulating layer to expose the conductor pattern;
    forming a first via by providing a conductive material in the first via hole such that the first via has a first contact portion in contact with external electrode; and
    forming a second via by providing a conductive material in the second via hole such that the second via has a second contact portion in contact with the conductor pattern, wherein a cross-sectional area of the first contact portion is larger than that of the second contact portion.

16. The method of manufacturing an electronic component embedded substrate according to claim 15, wherein the electronic component is a multilayer ceramic capacitor (MLCC).

17. The method of manufacturing an electronic component embedded substrate according to claim 15, wherein a plurality of vias are in contact with the conductor pattern, and the second via is the via closest to the first via among the plurality of vias formed in the conductor pattern.

18. The method of manufacturing an electronic component embedded substrate according to claim 15, wherein a contact surface of the electronic component and the first via and a contact surface of the conductor pattern and the second via are formed to be positioned on the same horizontal plane.

19. The method of manufacturing an electronic component embedded substrate according to claim 18, wherein the first via and the second via are formed to have the same height.

20. The method of manufacturing an electronic component embedded substrate according to claim 15, wherein the cross-sectional area of the first contact portion is more than 1.37 times the cross-sectional area of the second contact portion.

21. The method of manufacturing an electronic component embedded substrate according to claim 20, wherein a diameter of the first contact portion is greater than 35 μm.

22. The method of manufacturing an electronic component embedded substrate according to claim 20, wherein the diameter of the first contact portion is more than 1.17 times the diameter of the second contact portion.

23. The method of manufacturing an electronic component embedded substrate according to claim 20, wherein a maximum diameter of the first via is larger than that of the second via.

24. The method of manufacturing an electronic component embedded substrate according to claim 15, wherein a surface of the conductor pattern has a larger roughness than a surface of the external electrode.

25. The method of manufacturing an electronic component embedded substrate according to claim 15, wherein an insulating material is filled in a space between the cavity and the electronic component by forming the build-up insulating layer.

26. The method of manufacturing an electronic component embedded substrate according to claim 15, further comprising:
    forming a further build-up insulating layer on and under the insulating layer.

27. The method of manufacturing an electronic component embedded substrate according to claim 26, wherein the conductor patterns are formed on an upper surface and a lower surface of the insulating layer, and the second via is formed to be in contact with the conductor patterns on and under the insulating layer.

28. The method of manufacturing an electronic component embedded substrate according to claim 27, wherein the first via is formed to be in contact with the external electrode on and under the insulating layer.

29. A substrate comprising:
    an insulating portion;
    an electronic component having an electrode, the electronic component embedded in the insulating portion;
    an internal conductor pattern in the insulating portion;
    a first via passing through a part of the insulating portion and having a first contact portion abutting and attached to the electrode of the electronic component; and
    a second via passing through a part of the insulating portion and having a second contact portion abutting and attached to the conductor pattern, wherein the second contact portion has a smaller cross-sectional area than that of the first contact portion,
    wherein a lateral surface of the electrode is in contact with the insulating portion.

30. The substrate according to claim 29, wherein
    the cross-sectional area of the first contact portion is more than 1.37 times the cross-sectional area of the second contact portion.

31. The substrate according to claim 30, wherein
    the first and second vias are horizontally distanced from each other on the same horizontal plane, and
    the first contact portion and the second contact portion are substantially horizontally co-planar with each other.

32. The substrate according to claim 31, wherein the first via is tapered so as to be narrower toward the first contact portion, the second via is tapered so as to be narrower toward the second contact portion, and a maximum diameter of the first via is larger than that of the second via.

33. The substrate according to claim 29, wherein
the insulating portion comprises
- an insulating layer having a cavity in which the electronic component is positioned, and
- a build-up insulating layer through which the first and second vias pass, the build-up insulating layer being on the core insulating layer, and the internal conductor pattern is formed on one side of the insulating layer, and is electrically connected to a further internal conductor pattern on an opposite side of the insulating layer through a via passing through the insulating layer.

\* \* \* \* \*